(12) United States Patent
Gowda et al.

(10) Patent No.: US 10,269,688 B2
(45) Date of Patent: Apr. 23, 2019

(54) POWER OVERLAY STRUCTURE AND METHOD OF MAKING SAME

(71) Applicant: General Electric Company, Schenectady, NY (US)

(72) Inventors: Arun Virupaksha Gowda, Rexford, NY (US); Paul Alan McConnelee, Albany, NY (US); Shakti Singh Chauhan, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 972 days.

(21) Appl. No.: 13/897,685

(22) Filed: May 20, 2013

(65) Prior Publication Data

US 2014/0264800 A1    Sep. 18, 2014

Related U.S. Application Data

(60) Provisional application No. 61/784,834, filed on Mar. 14, 2013.

(51) Int. Cl.
*H01L 23/34* (2006.01)
*H01L 23/495* (2006.01)
(Continued)

(52) U.S. Cl.
CPC .... *H01L 23/49568* (2013.01); *H01L 23/4334* (2013.01); *H01L 23/4952* (2013.01);
(Continued)

(58) Field of Classification Search
CPC ............. H01L 23/3675; H01L 25/0655; H01L 23/4334; H01L 23/5389; H01L 24/19;
(Continued)

(56) References Cited

U.S. PATENT DOCUMENTS 3,586,102 A    6/1971  Richard
4,561,011 A   12/1985  Kohara et al.
(Continued)

FOREIGN PATENT DOCUMENTS

CN    1969383 A    5/2007
CN  101202259 A    6/2008
(Continued)

OTHER PUBLICATIONS

Oxford Dictionaries, Wayback Machine, May 2, 2013.*
(Continued)

*Primary Examiner* — Ismail A Muse
*Assistant Examiner* — Patricia D Reddington
(74) *Attorney, Agent, or Firm* — Ziolkowski Patent Solutions Group, SC

(57) ABSTRACT

A semiconductor device module includes a dielectric layer, a semiconductor device having a first surface coupled to the dielectric layer, and a conducting shim having a first surface coupled to the dielectric layer. The semiconductor device also includes an electrically conductive heatspreader having a first surface coupled to a second surface of the semiconductor device and a second surface of the conducting shim. A metallization layer is coupled to the first surface of the semiconductor device and the first surface of the conducting shim. The metallization layer extends through the dielectric layer and is electrically connected to the second surface of the semiconductor device by way of the conducting shim and the heatspreader.

21 Claims, 13 Drawing Sheets

(51) Int. Cl.
*H01L 23/433* (2006.01)
*H01L 23/538* (2006.01)
*H01L 23/00* (2006.01)

(52) U.S. Cl.
CPC .... *H01L 23/49541* (2013.01); *H01L 23/5389* (2013.01); *H01L 24/19* (2013.01); *H01L 24/24* (2013.01); *H01L 24/83* (2013.01); *H01L 24/92* (2013.01); *H01L 2224/0401* (2013.01); *H01L 2224/04105* (2013.01); *H01L 2224/12105* (2013.01); *H01L 2224/24137* (2013.01); *H01L 2224/32225* (2013.01); *H01L 2224/32245* (2013.01); *H01L 2224/48227* (2013.01); *H01L 2224/73265* (2013.01); *H01L 2224/73267* (2013.01); *H01L 2224/83192* (2013.01); *H01L 2224/83801* (2013.01); *H01L 2224/9222* (2013.01); *H01L 2224/92144* (2013.01); *H01L 2924/00* (2013.01); *H01L 2924/00014* (2013.01); *H01L 2924/12042* (2013.01); *H01L 2924/15311* (2013.01); *H01L 2924/15312* (2013.01); *H01L 2924/15747* (2013.01); *H01L 2924/15787* (2013.01); *H01L 2924/181* (2013.01)

(58) Field of Classification Search
CPC ......... H01L 24/24; H01L 24/83; H01L 24/92; H01L 2224/0401; H01L 2224/04105; H01L 2224/12105; H01L 2224/24137; H01L 2224/32225; H01L 2224/73267; H01L 2224/83192; H01L 2224/92144; H01L 2224/9222; H01L 2924/12042; H01L 2924/15311; H01L 2924/15312; H01L 2924/15747; H01L 2924/15787; H01L 2924/181; H01L 23/49568; H01L 23/4952
USPC ...................................................... 257/713
See application file for complete search history.

(56) References Cited

U.S. PATENT DOCUMENTS

| | | | |
|---|---|---|---|
| 5,250,843 A | 10/1993 | Eichelberger | |
| 5,315,486 A | 5/1994 | Fillion et al. | |
| 5,888,884 A | 3/1999 | Wojnarowski | |
| 5,926,696 A | 7/1999 | Baxter et al. | |
| 6,013,356 A * | 1/2000 | Horiguchi | H01L 23/49883 174/257 |
| 6,030,854 A | 2/2000 | Mashimoto et al. | |
| 6,104,078 A | 8/2000 | Iida et al. | |
| 6,154,366 A | 11/2000 | Ma et al. | |
| 6,232,151 B1 | 5/2001 | Ozmat et al. | |
| 6,297,550 B1 | 10/2001 | Chia et al. | |
| 6,306,680 B1 * | 10/2001 | Fillion et al. | 438/106 |
| 6,534,859 B1 | 3/2003 | Shim et al. | |
| 6,558,977 B2 | 5/2003 | Nakaoka et al. | |
| 6,707,671 B2 | 3/2004 | Yamashita et al. | |
| 6,710,463 B2 | 3/2004 | Choi | |
| 6,777,800 B2 | 8/2004 | Madrid et al. | |
| 7,015,640 B2 | 3/2006 | Schaepkens et al. | |
| 7,190,581 B1 | 3/2007 | Hassani et al. | |
| 7,262,444 B2 | 8/2007 | Fillion et al. | |
| 7,688,497 B2 | 3/2010 | Danner et al. | |
| 7,733,554 B2 | 6/2010 | Danner et al. | |
| 7,763,969 B2 | 7/2010 | Zeng et al. | |
| 7,781,882 B2 * | 8/2010 | Zhong et al. | 257/707 |
| 7,804,131 B2 | 9/2010 | Cheah et al. | |
| 7,999,369 B2 | 8/2011 | Malhan et al. | |
| 8,018,056 B2 | 9/2011 | Hauenstein | |
| 8,097,490 B1 * | 1/2012 | Pagaila | H01L 21/561 257/E21.007 |
| 8,304,903 B2 | 11/2012 | Herbsommer et al. | |
| 8,395,269 B2 | 3/2013 | Kawano et al. | |
| 8,409,922 B2 | 4/2013 | Camacho et al. | |
| 8,409,926 B2 | 4/2013 | Lin et al. | |
| 8,581,416 B2 | 11/2013 | Massie et al. | |
| 8,941,208 B2 | 1/2015 | Chauhan et al. | |
| 8,987,876 B2 | 3/2015 | Gowda et al. | |
| 9,001,524 B1 | 4/2015 | Akre | |
| 9,299,630 B2 | 3/2016 | Gowda et al. | |
| 2001/0023983 A1 | 9/2001 | Kobayashi et al. | |
| 2001/0030059 A1 * | 10/2001 | Sugaya | H01L 21/56 174/256 |
| 2002/0074146 A1 | 6/2002 | Okubora | |
| 2002/0167062 A1 | 11/2002 | Narita | |
| 2003/0077951 A1 | 4/2003 | Sturgeon et al. | |
| 2003/0122232 A1 | 7/2003 | Hirano et al. | |
| 2004/0070087 A1 * | 4/2004 | Wang | H01L 23/481 257/787 |
| 2004/0201081 A1 | 10/2004 | Joshi et al. | |
| 2005/0045855 A1 * | 3/2005 | Tonapi | C09K 5/14 252/500 |
| 2005/0046079 A1 | 3/2005 | Murugan | |
| 2005/0167849 A1 | 8/2005 | Sato | |
| 2005/0218486 A1 | 10/2005 | Morrison et al. | |
| 2005/0258533 A1 * | 11/2005 | Kumano et al. | 257/712 |
| 2006/0018607 A1 | 1/2006 | Rosenberg | |
| 2006/0044772 A1 | 3/2006 | Miura | |
| 2006/0103005 A1 | 5/2006 | Schulz-Harder et al. | |
| 2006/0128069 A1 | 6/2006 | Hsu | |
| 2006/0151860 A1 | 7/2006 | Islam et al. | |
| 2006/0166397 A1 | 7/2006 | Lau et al. | |
| 2006/0177098 A1 | 8/2006 | Stam | |
| 2006/0183349 A1 | 8/2006 | Farnworth et al. | |
| 2007/0035033 A1 | 2/2007 | Ozguz et al. | |
| 2007/0138651 A1 | 6/2007 | Hauenstein | |
| 2007/0145547 A1 | 6/2007 | McKerreghan et al. | |
| 2007/0196950 A1 | 8/2007 | Shirai et al. | |
| 2007/0257343 A1 | 11/2007 | Hauenstein et al. | |
| 2007/0262436 A1 | 11/2007 | Kweon et al. | |
| 2007/0295387 A1 | 12/2007 | Adriani et al. | |
| 2008/0006936 A1 | 1/2008 | Hsu | |
| 2008/0122061 A1 * | 5/2008 | Edwards | H01L 23/3677 257/690 |
| 2008/0142954 A1 | 6/2008 | Hu | |
| 2008/0164588 A1 | 7/2008 | Lee et al. | |
| 2008/0303125 A1 | 12/2008 | Chen et al. | |
| 2009/0207574 A1 | 8/2009 | Chen et al. | |
| 2009/0291296 A1 | 11/2009 | McConnelee et al. | |
| 2010/0059853 A1 * | 3/2010 | Lin | H01L 27/016 257/528 |
| 2010/0230800 A1 | 9/2010 | Beaupre et al. | |
| 2010/0244225 A1 | 9/2010 | Sabatini et al. | |
| 2010/0308453 A1 * | 12/2010 | Scheid et al. | 257/698 |
| 2011/0045634 A1 * | 2/2011 | Pagaila | H01L 24/19 438/107 |
| 2011/0233690 A1 | 9/2011 | Feiertag et al. | |
| 2011/0291249 A1 | 12/2011 | Chi et al. | |
| 2012/0014069 A1 | 1/2012 | Zeng et al. | |
| 2012/0270354 A1 | 10/2012 | Hooper et al. | |
| 2013/0043571 A1 | 2/2013 | Gowda et al. | |
| 2014/0029210 A1 | 1/2014 | Gowda et al. | |
| 2014/0061893 A1 * | 3/2014 | Saeidi | H01L 23/16 257/712 |
| 2014/0262449 A1 * | 9/2014 | Gektin | H01L 23/4006 174/252 |
| 2015/0194375 A1 | 7/2015 | Gowda et al. | |
| 2017/0077014 A1 | 3/2017 | Gowda et al. | |
| 2017/0263539 A1 | 9/2017 | Gowda et al. | |

FOREIGN PATENT DOCUMENTS

| | | | |
|---|---|---|---|
| JP | 06177320 A | 6/1994 | |
| JP | 07321257 A | 12/1995 | |
| JP | 407321257 A | 12/1995 | |
| JP | 11121662 A | 4/1999 | |
| JP | 411121662 A | 4/1999 | |
| JP | 2000049280 A | 2/2000 | |
| JP | 2002050889 A | 2/2002 | |
| JP | 2003258166 A | 9/2003 | |

(56) References Cited

FOREIGN PATENT DOCUMENTS

| JP | 2005223008 A | 8/2005 |
|---|---|---|
| JP | 2005228929 A | 8/2005 |
| JP | 2006278771 A | 10/2006 |
| JP | 2007521656 A | 8/2007 |
| JP | 2009059760 A | 3/2009 |
| JP | 2009076657 A | 4/2009 |
| JP | 2009130044 A | 6/2009 |
| JP | 2013042135 A | 2/2013 |
| WO | 2005051525 A1 | 6/2005 |
| WO | 2011103341 A1 | 8/2011 |

OTHER PUBLICATIONS

"Improved Direct Bond Copper (DBC) Substrate for High Temperature Packaging", Abstract, Virginia Tech Center for Power Electronics Systems, 2008, p. 1, www.cpes.vt.edu/public/showcase/DBC.php.

Jensen, "Ultra-Thin Moisture Barrier Coatings for Passive Components," Abstract, Massachusetts Institute of Technology, Jun. 2004, p. 1.

Yin, "High Temperature SiC Embedded Chip Module (ECM) with Double-Sided Metallization Structure", Virginia Polytechnic Institute and State University, Blacksburg, Virginia, Dec. 2005, pp. I-XIII and 1-159.

Kokko et al, "Thermal Cycling of Flip Chips on FR-4 and PI Substrates with Parylene C Coating," Surface Mount Technology, vol. 22, No. 3, 2010, pp. 42-48.

Wakharkar et al., "Materials Technologies for Themomechanical Management of Organic Packages", Intel Technology Journal, vol. 9, Issue 4, Nov. 9, 2005, pp. 309-324.

Wu et al., "Interface-Adhesion-Enhanced Bi-Layer Conformal Coating for Avionics Application," Proceedings International Symposium on Advanced Packaging Materials: Processes, Properties and Interfaces, Mar. 14-17, 1999, pp. 302-310.

Kaltenpoth et al., "The Effect of PECVD SiN Moisture Barrier Layers on the Degradation of a Flip Chip Underfill Material," Soldering & Surface Mount Technology, vol. 13, No. 3, 2001, pp. 12-15.

Huang et al., "Effect of Organic/Inorganic Coating on Moisture Diffusion in a Chip-On-Board Package with Globtop," Journal of Electronic Materials, 2004, vol. 33, No. 2, 2004, pp. 101-105.

U.S. Appl. No. 14/665,735, filed Mar. 23, 2015, Arun Virupaksha Gowda et al.

U.S. Appl. No. 13/211,057, filed Aug. 16, 2011, Arun Virupaksha Gowda et al.

U.S. Appl. No. 13/561,811, filed Jul. 30, 2012, Shakti Singh Chauhan et al.

U.S. Appl. No. 13/561,868, filed Jul. 30, 2012, Arun Virupaksha Gowda et al.

U.S. Appl. No. 15/363,237, filed Nov. 29, 2016, Arun Virupaksha Gowda et al.

U.S. Notice of Allowance office Action issued in connection with Related U.S. Appl. No. 13/211,057 dated Oct. 9, 2013.

U.S. Non-Final office Action issued in connection with Related U.S. Appl. No. 13/561,811 dated Apr. 10, 2014.

U.S. Non-Final office Action issued in connection with Related U.S. Appl. No. 13/561,868 dated Oct. 17, 2014.

U.S. Non-Final office Action issued in connection with Corresponding U.S. Appl. No. 13/897,638 dated Apr. 24, 2014.

U.S. Non-Final office Action issued in connection with Related U.S. Appl. No. 13/561,868 dated Mar. 3, 2015.

U.S. Non-Final office Action issued in connection with Related U.S. Appl. No. 14/165,707 dated Mar. 5, 2015.

U.S. Non-Final office Action issued in connection with Related U.S. Appl. No. 14/165,725 dated Mar. 16, 2015.

European Search Report and Opinion issued in connection with corresponding EP Application No. 14159735.1 dated Mar. 27, 2015.

European Search Report and Opinion issued in connection with corresponding EP Application No. 14159901.9 dated Mar. 27, 2015.

U.S. Final office Action issued in connection with Related U.S. Appl. No. 13/561,868 dated Jun. 17, 2015.

U.S. Notice of Allowance office Action issued in connection with Related U.S. Appl. No. 14/165,707 dated Jun. 22, 2015.

U.S. Notice of Allowance office Action issued in connection with Related U.S. Appl. No. 14/165,725 dated Jun. 22, 2015.

European Search Report and Opinion issued in connection with corresponding EP Application No. 13177219.6 dated Jun. 24, 2015.

Unofficial English Translation of Chinese office Action issued in connection with Related CN Application No. 201210291894.5 dated Feb. 15, 2016.

U.S. Non-Final office Action issued in connection with Corresponding U.S. Appl. No. 14/665,735 dated May 19, 2016.

Unofficial English Translation of Japanese office Action issued in connection with Related JP Application No. 2012179136 dated May 24, 2016.

Unofficial English Translation of Taiwan office Action issued in connection with Related TW Application No. 102125294 dated Oct. 12, 2016.

Taiwan office Action issued in connection with Related TW Application No. 102125293 dated Oct. 26, 2016.

European office Action issued in connection with Corresponding EP Application No. 14159735.1 dated Nov. 2, 2016.

Unofficial English Translation of Japanese Search Report issued in connection with Related JP Application No. 2012179136 dated Dec. 2, 2016.

Machine Translation and Japanese Office Action issued in connection with corresponding JP Application No. 2014048289 dated Feb. 20, 2018.

Machine Translation and Japanese Office Action issued in connection with corresponding JP Application No. 2014048290 dated Mar. 27, 2018.

* cited by examiner

POWER OVERLAY STRUCTURE AND METHOD OF MAKING SAME

CROSS-REFERENCE TO RELATED APPLICATION

The present application claims priority to U.S. Provisional Patent Application Ser. No. 61/784,834 filed Mar. 14, 2013, the disclosure of which is incorporated herein by reference.

BACKGROUND OF THE INVENTION

Embodiments of the invention relate generally to structures and methods for packaging semiconductor devices and, more particularly, to a power overlay (POL) packaging structure that includes an improved thermal interface.

Power semiconductor devices are semiconductor devices used as switches or rectifiers in power electronic circuits, such as switched mode power supplies, for example. Most power semiconductor devices are only used in commutation mode (i.e., they are either on or off), and are therefore optimized for this. Many power semiconductor devices are used in high voltage power applications and are designed to carry a large amount of current and support a large voltage. In use, high voltage power semiconductor devices are connected to an external circuit by way of a power overlay (POL) packaging and interconnect system.

The general structure of a prior art power overlay (POL) structure 10 is shown in FIG. 1. The standard manufacturing process for the POL structure 10 typically begins with placement of one or more power semiconductor devices 12 onto a dielectric layer 14 by way of an adhesive 16. Metal interconnects 18 (e.g., copper interconnects) are then electroplated onto dielectric layer 14 to form a direct metallic connection to the power semiconductor devices 12. The metal interconnects 18 may be in the form of a low profile (e.g., less than 200 micrometers thick), planar interconnect structure that provides for formation of an input/output (I/O) system 20 to and from the power semiconductor devices 12. For connecting to an external circuit, such as by making a second level interconnection to a printed circuit board for example, current POL packages use solder ball grid arrays (BGAs) or land grid arrays (LGAs).

A heat sink 22 is also typically included in the POL structure 10 to providing a way to remove the heat generated by semiconductor devices 12 and protect the devices 12 from the external environment. Heat sink 22 is thermally coupled to the devices 12 using a direct bond copper (DBC) substrate 24. As shown, DBC substrate 24 is positioned between the upper surfaces of semiconductor devices 12 and the lower surface of heat sink 22.

DBC substrate 24 is a prefabricated component that includes a non-organic ceramic substrate 26 such as, for example, alumina, with upper and lower sheets of copper 28, 30 bonded to both sides thereof via a direct bond copper interface or braze layer 31. The lower copper sheet 30 of DBC substrate 24 is patterned to form a number of conductive contact areas before DBC substrate 24 is attached to semiconductor devices 12. A typically DBC substrate may have an overall thickness of approximately 1 mm.

During the fabrication process of POL structure 10, solder 32 is applied to the surfaces of semiconductor devices 12. DBC substrate 24 is then lowered onto solder 32 to align the patterned portions of lower copper sheet 30 with solder 32. After DBC substrate 24 is coupled to semiconductor devices 12, an underfill technique is used to apply a dielectric organic material 34 in the space between adhesive layer 16 and DBC substrate 24 to form a POL sub-module 36. A thermal pad or thermal grease 38 is then applied to the upper copper layer 28 of DBC substrate 24.

The use of a DBC substrate in a POL structure 10 has a number of limitations. First, the material properties of the copper and ceramic materials of the DBC substrate place inherent limitations on the design of the DBC substrate. For example, due to the inherent stiffness of ceramics and the differences in the thermal expansion coefficients of the copper and ceramic materials of DBC substrate 24, copper sheets 28, 30 must be kept relatively thin to avoid undue stresses placed on the ceramics caused by large swings in temperature in the copper material. In addition, since the surface of the lower copper layer of the DBC substrate 24 that faces semiconductor device(s) 12 is planar, the DBC substrate 24 does not facilitate fabrication of a POL package having semiconductor devices of differing height.

Also, DBC substrates are relatively expensive to manufacture and are a prefabricated component. As DBC substrate 24 is a prefabricated component, the thickness of copper sheets 28, 30 is predetermined based on the thickness of the copper foil layer applied to the ceramic substrate 26. Also, because DBC substrate 24 is fabricated prior to assembly with the remainder of the components of the POL structure, the dielectric filler or epoxy substrate that surrounds the semiconductor devices 12 is applied using an underfill technique after the DBC substrate 24 is coupled to semiconductor devices 12. This underfill technique is time consuming and can result in undesirable voids within the POL structure.

Therefore, it would be desirable to provide a POL structure having an improved thermal interface that overcomes the aforementioned structural and processing limitations of known POL structures that incorporate a DBC substrate. It would further be desirable for such a POL structure to account for semiconductor devices of different thickness while minimizing cost of the POL structure.

BRIEF DESCRIPTION OF THE INVENTION

Embodiments of the invention overcome the aforementioned drawbacks by providing a power overlay (POL) structure that eliminates the usage of a DBC substrate as a thermal interface between a POL sub-module and a heat sink. An improved thermal interface is provided for semiconductor devices that includes conducting shims that account for semiconductor devices of varying heights.

In accordance with one aspect of the invention, a semiconductor device module includes a dielectric layer, a semiconductor device having a first surface coupled to the dielectric layer, and a conducting shim having a first surface coupled to the dielectric layer. The semiconductor device also includes an electrically conductive heatspreader having a first surface coupled to a second surface of the semiconductor device and a second surface of the conducting shim. A metallization layer is coupled to the first surface of the semiconductor device and the first surface of the conducting shim. The metallization layer extends through the dielectric layer and is electrically connected to the second surface of the semiconductor device by way of the conducting shim and the heatspreader.

In accordance with another aspect of the invention, a method of forming a semiconductor device package includes providing a semiconductor device, affixing a first surface of the semiconductor device to a first surface of a dielectric layer, and affixing a first surface of a conductive shim to the first surface of the dielectric layer. The method also includes disposing a heatspreader on a second surface of the semiconductor device and a second surface of the conductive shim, the heatspreader electrically coupling the semiconductor device to the conducting shim, and forming a metal interconnect structure on a second surface of the dielectric layer. The metal interconnect structure extends through vias formed in the dielectric layer to contact the first surface of the semiconductor device and the first surface of the conductive shim.

In accordance with yet another aspect of the invention, a power overlay (POL) structure includes an insulating substrate, a power device attached to the insulating substrate via an adhesive layer and an electrically conducting shim attached to the insulating substrate via the adhesive layer. The POL structure further includes an electrically and thermally conducting slab coupled to a top surface of the power device and a top surface of the conducting shim and a metallization layer extending through the insulating substrate. The metallization layer is electrically coupled to contact locations on the first and second surfaces of the power device.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings.

DETAILED DESCRIPTION

Embodiments of the present invention provide for a power overlay (POL) structure having an improved thermal interface included therein, as well as a method of forming such a POL structure. The POL structure includes conducting shims that account for semiconductor devices of varying heights and a thermal interface layer that increases options for encapsulation materials and methods.

Figure 1:
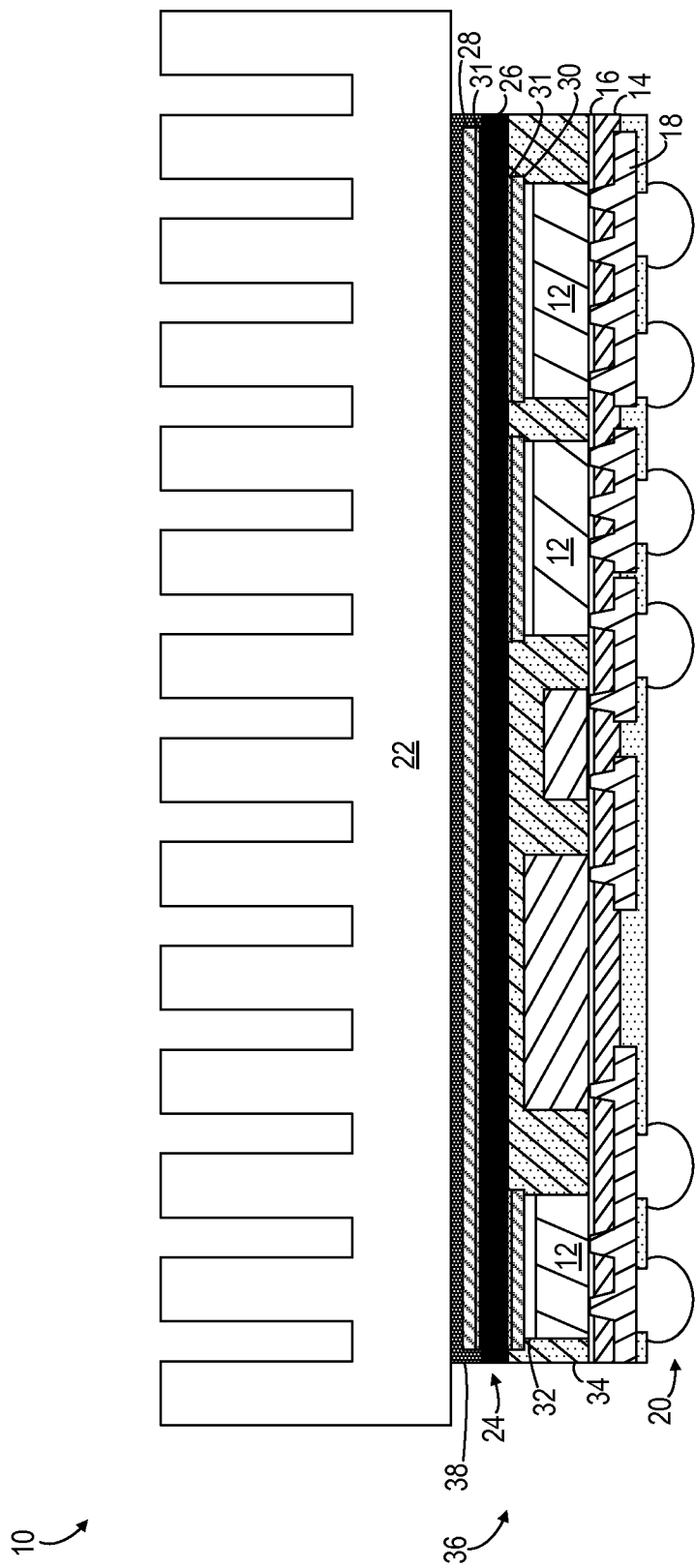
FIG. 1 is a schematic cross-sectional side view of a prior art power overlay (POL) structure incorporating a DBC substrate.
Figure 2:
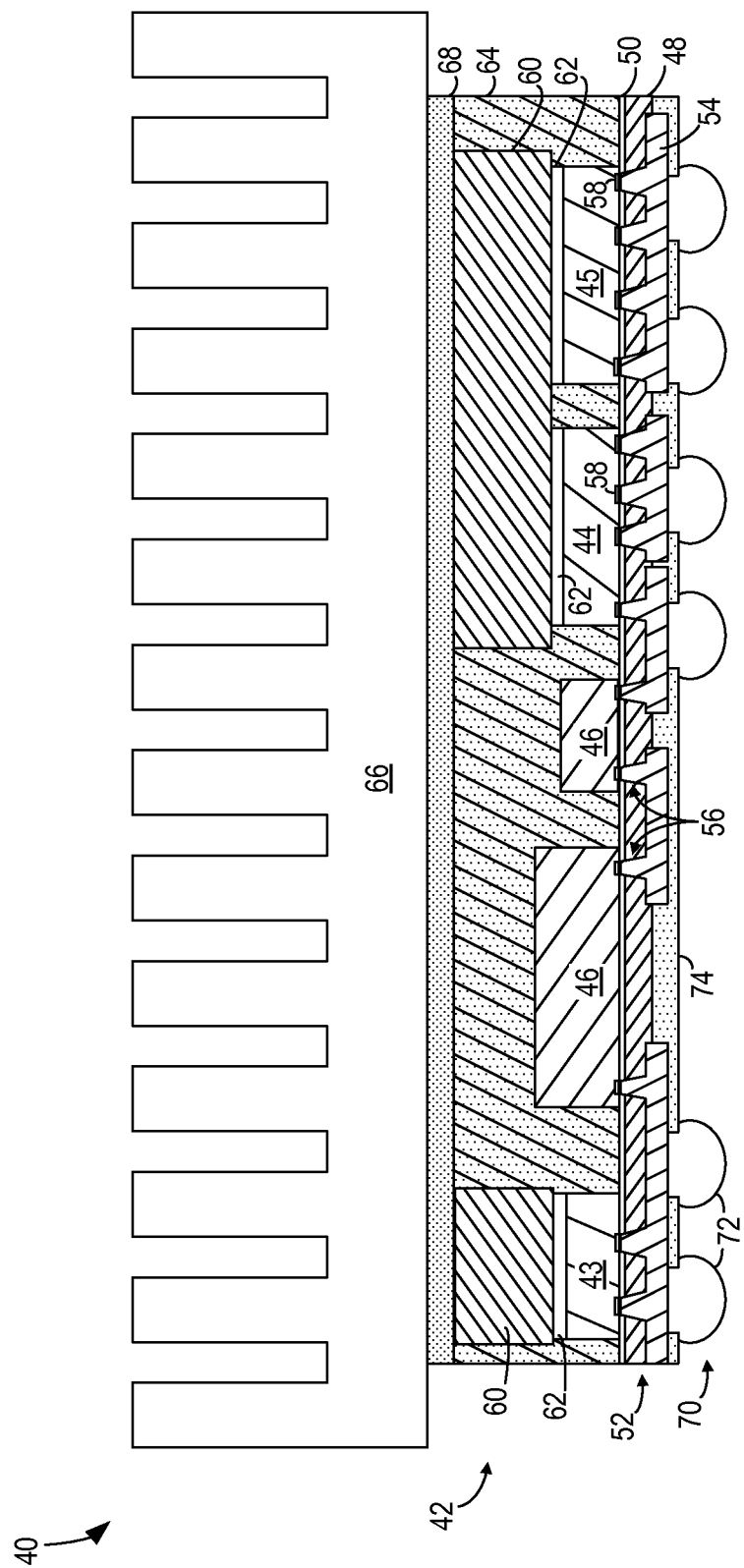
FIG. 2 is a schematic cross-sectional side view of a POL structure according to an embodiment of the invention.

Referring to FIG. 2, a semiconductor device assembly or power overlay (POL) structure 40 is shown according to an embodiment of the invention. POL structure 40 includes a POL sub-module 42 having one or more semiconductor devices 43, 44, 45 therein that, according to various embodiments, may be in the form of a die, diode, or other power electric device. As shown in FIG. 2, three semiconductor devices 43, 44, 45 are provided in POL sub-module 42, however, it is recognized that a greater or lesser number of semiconductor devices 43, 44, 45 could be included in POL sub-module 42. Further, while parts 44 and 45 are described herein as being semiconductor devices, one or more of parts 44, 45 may be electrically conductive shims, as described in more detail with respect to FIGS. 21-23. In addition to semiconductor devices 43, 44, 45, POL sub-module 42 may also include any number of additional circuitry components 46 such as, for example, a gate driver.

Semiconductor devices 43, 44, 45 are coupled to a dielectric layer 48 by way of an adhesive layer 50. Dielectric layer 48 may be in the form of a lamination or a film, according to various embodiments, and may be formed of one a plurality of dielectric materials, such as Kapton®, Ultem®, polytetrafluoroethylene (PTFE), Upilex®, polysulfone materials (e.g., Udel®, Radel®), or another polymer film, such as a liquid crystal polymer (LCP) or a polyimide material.

POL sub-module 42 also includes a metallization layer or interconnect structure 52, which forms a direct metallic connection to semiconductor devices 43, 44, 45 by way of a metal interconnects 54 that extends through vias 56 formed in dielectric layer 48 to connect to contact pads 58 on respective semiconductor devices 43, 44, 45.

POL sub-module 42 further includes one or more conducting slabs or heatspreaders 60, which are secured to semiconductor devices 43, 44, 45 with a thermally and electrically conductive contact layer 62. According to various embodiments, conductive contact layer 62 may be a solder material, a conductive adhesive, or a sintered silver, as examples. Conducting slabs 60 are a metal or alloy material, such as, for example, copper, aluminum, molybdenum, or combinations thereof such as copper-molybdenum or copper-tungsten, and composites such as aluminum-silicon, aluminum-silicon carbide, aluminum-graphite, copper-graphite and the like.

A dielectric filler material 64 is also provided in POL sub-module 42 to fill gaps in the POL sub-module 42 between and around semiconductor devices 43, 44, 45 and conducting slabs 60, so as to provide additional structural integrity to POL sub-module 42. According to various embodiments, dielectric filler material 64 may be in the form of a polymeric material, such as, for example, an underfill (e.g., capillary underfill or no-flow underfill), encapsulate, silicone, or a molding compound.

POL structure 40 also includes a heat sink 66 to facilitate cooling of semiconductor devices 43, 44, 45. Heat sink 66 comprises a material having a high thermal conductivity, such as copper, aluminum, or a composite material. Heat sink 66 is coupled to POL sub-module 42 by way of a thermal interface substrate or layer 68 formed over conducting slabs 60 and dielectric filler material 64.

Thermal interface layer 68 is a thermally conductive, electrically insulating polymeric or organic material such as, for example, a thermal pad, a thermal paste, a thermal grease, or a thermal adhesive. Thermal interface layer 68 electrically isolates heat sink 66 from conducting slabs 60. According to one embodiment, thermal interface layer 68 comprises conductive fillers, particles, or fibers suspended in a matrix of resin or epoxy. For example, thermal interface layer 68 may be an epoxy or silicon resin that is filled with thermally conductive, electrically insulating fillers such as alumina and/or boron nitride. According to one embodiment, thermal interface layer 68 has a thickness of approximately 100 µm. However, one skilled in the art will recognize that the thickness of thermal interface layer 68 may vary based on design specifications. Thermal interface layer 68 provides superior thermal performance as compared to a DBC substrate because thermal interface layer 68 is not subject to the thermal resistance of the ceramic layer included within a DBC substrate.

In embodiments where thermal interface layer 68 is a thermal paste, a thermal grease, or a thermal pad, such as, for example a pre-formed sheet or film of organic material, heat sink 66 is secured to POL sub-module 42 using screws or other fastening devices (not shown), at a number of locations around the perimeter of POL sub-module 42 causing thermal interface layer 68 to be sandwiched between conducting slabs 60 and heat sink 66. Alternatively, in embodiments where thermal interface layer 68 is a polymeric adhesive, thermal interface layer 68 is applied to POL sub-module 42 in a tacky state and cured after heat sink 66 is positioned atop thermal interface layer 68, thereby bonding heat sink 66 to POL sub-module 42 absent additional fasteners. POL sub-module 42 also includes an input-output (I/O) connection 70 to enable surface mounting of the POL structure 40 to an external circuit, such as a printed circuit board (PCB), as described in more detail with respect to FIG. 5. According to an exemplary embodiment, I/O connection 70 is formed of ball grid array (BGA) solder bumps 72 that are configured to be attached/affixed to the PCB to electrically couple POL structure 40 to the PCB, although other suitable second-level solder interconnections, such as land grid array (LGA) pads, could also be used. The BGA solder bumps 72 provide a highly reliable interconnection structure that is resistive to failure in high stress conditions. As illustrated in FIG. 2, solder bumps 72 are positioned in openings formed in a solder mask layer 74 of POL sub-module 42.

Figure 3:
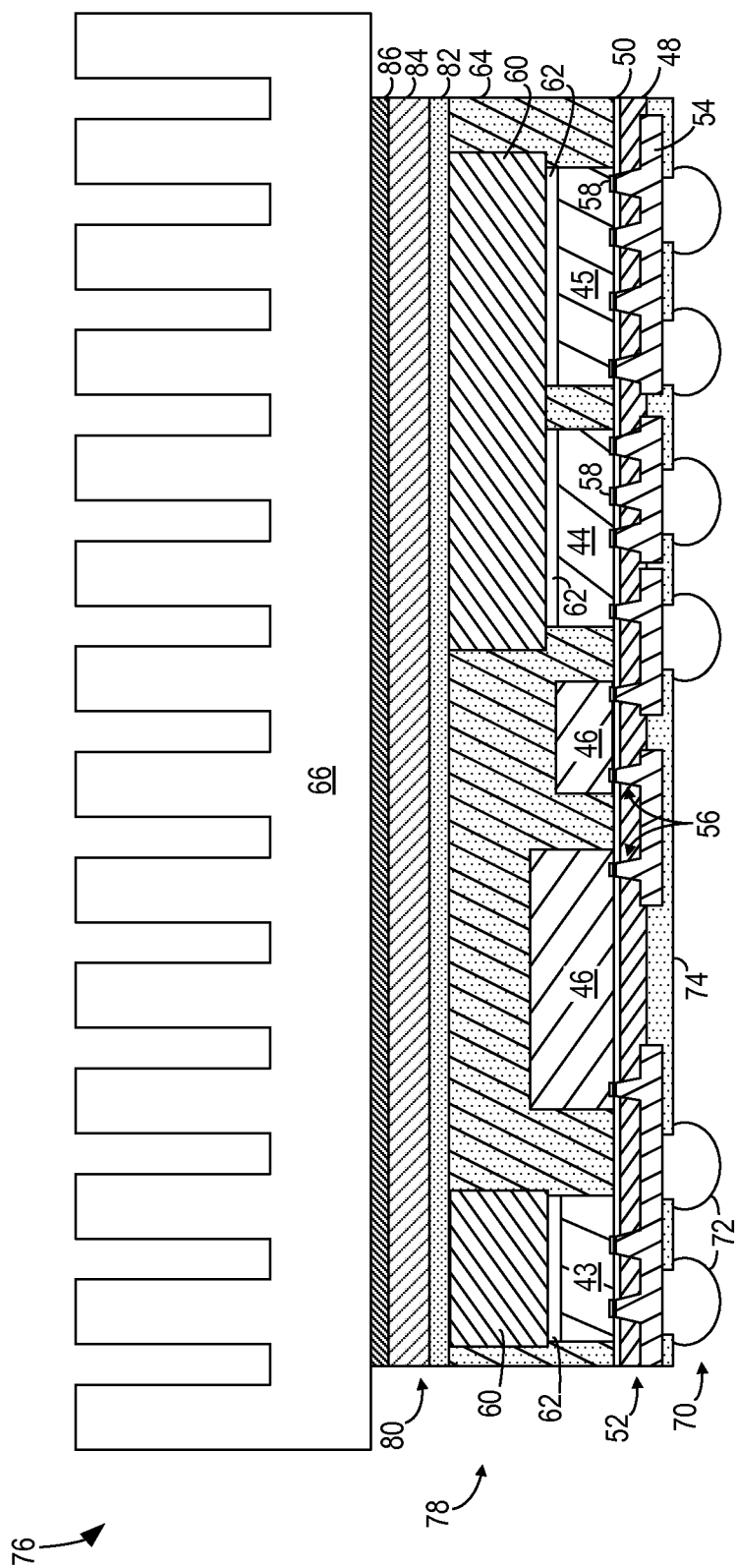
FIG. 3 is a schematic cross-sectional side view of a POL structure according to another embodiment of the invention.

Referring now to FIG. 3, a POL structure 76 and POL sub-module 78 are shown according an alternative embodiment of the invention. POL structure 76 and POL sub-module 78 include a number of components similar to components shown in POL structure 40 and POL sub-module 42 of FIG. 2, and thus numbers used to indicate components in FIG. 2 will also be used to indicate similar components in FIG. 3.

As shown, POL sub-module 78 includes a multi-layer thermal interface 80 positioned between conducting slabs 60 and heat sink 66. Multi-layer thermal interface 80 includes a first thermal interface layer 82, a ceramic insulator layer 84, and a second thermal interface layer 86. The inclusion of ceramic insulator layer 84 between POL sub-module 78 and heat sink 66 provides additional electrical isolation for high voltage applications. Insulator layer 84 may be constructed of a ceramic material such as alumina or aluminum nitride, as examples.

As shown, first thermal interface layer 82 is sandwiched between conducting slabs 60 and ceramic insulator layer 84. According to one embodiment first thermal interface layer 82 of FIG. 3 comprises a thermally conductive, electrically insulating material similar to thermal interface layer 68 of FIG. 2 that permits the transfer of heat from conducting slabs 60 to heat sink 66 while electrically isolating conducting slabs 60 from heat sink 66. In an exemplary embodiment, first thermal interface layer 82 comprises an epoxy or silicon resin that is filled with thermally conductive but electrically insulating fillers such as alumina or boron nitride.

Figure 4:
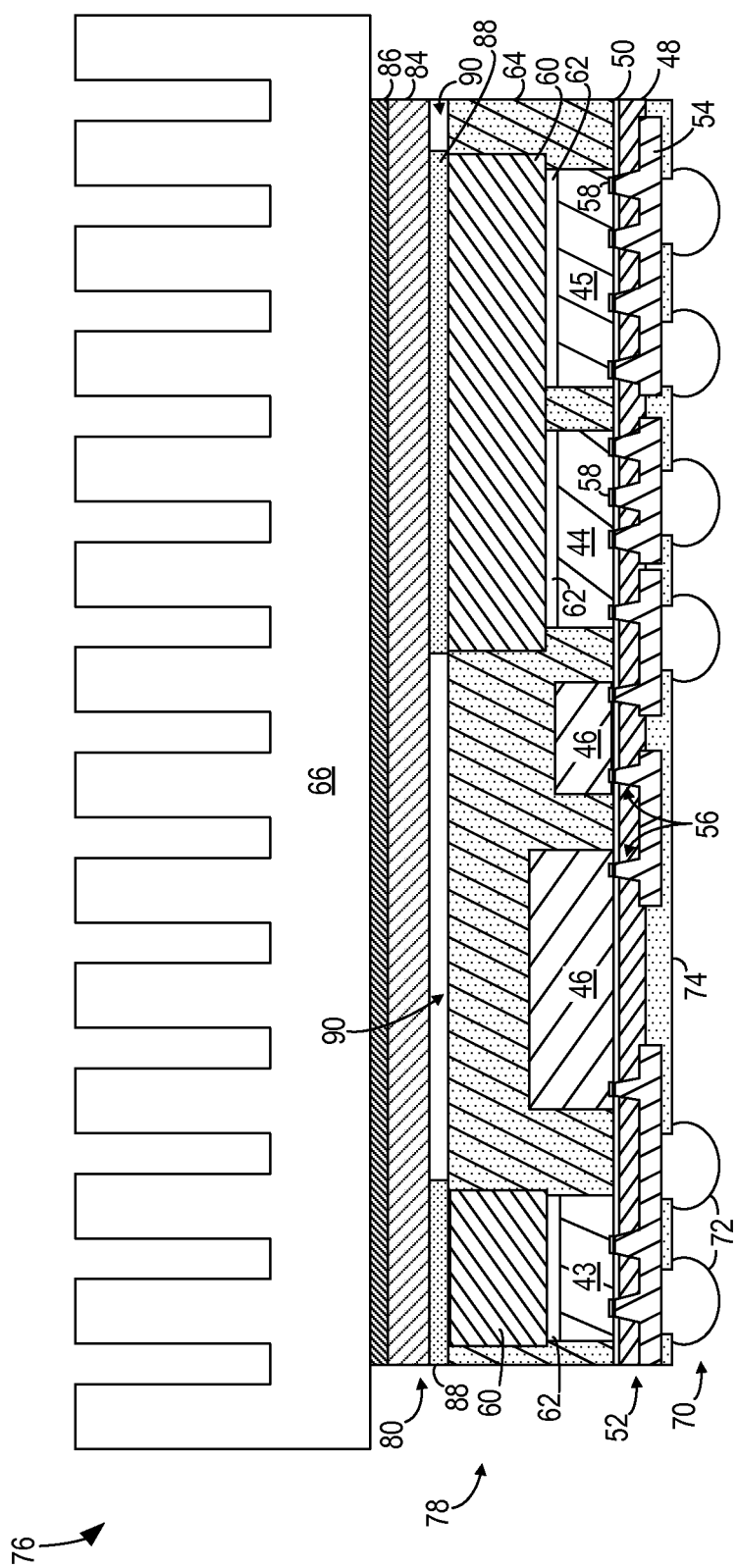
FIG. 4 is a schematic cross-sectional side view of a POL structure according to yet another embodiment of the invention.

In an alternative embodiment, first thermal interface layer 82 comprises an electrically conductive material, such as, for example, solder, conductive adhesive, or sintered silver, formed as a number of discrete pads 88 atop conducting slabs 60, as illustrated in FIG. 4. Lateral spaces 90 between adjoining pads 88 may be left as air gaps or be filled with dielectric filler material 64, according to various embodiments.

Referring now to FIG. 3 and FIG. 4 together, second thermal interface layer 86 is sandwiched between ceramic insulator layer 84 and heat sink 66. According to one embodiment, second thermal interface layer 86 comprises a thermally conductive, electrically insulating material similar to thermal interface layer 68 of FIG. 2. In an alternative embodiment, second thermal interface layer 86 is a material that is both thermally and electrically conductive, such as, for example, an epoxy or silicon resin filled with silver.

Figure 5:
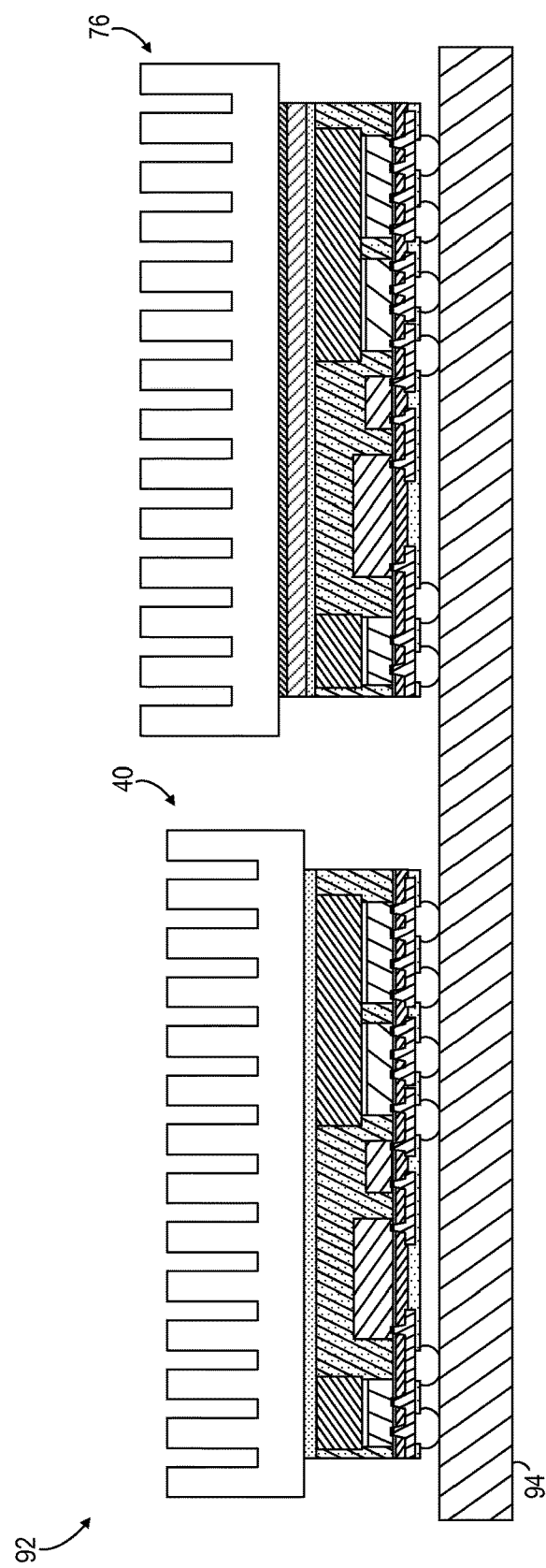
FIG. 5 is a schematic cross-sectional side view of a POL assembly according to an embodiment of the invention.

FIG. 5 illustrates a POL assembly 92 incorporating POL structure 40 (FIG. 2) and POL structure 76 (FIGS. 3, 4) in accordance with an embodiment of the invention. As shown, respective I/O connections 70 of POL structures 40, 76 are coupled to an external circuit component 94, such as, for example, a printed circuit board (PCB). While two POL structures 40, 76 are illustrated in POL assembly 92, one skilled in the art will recognize that POL assembly 92 may include any number of POL structures, according to various embodiments of the invention. Further, POL assembly 92 may include multiple POL structures of a single type, such as two or more POL structures 40 or two or more POL structures 76.

While the embodiments described with respect to FIGS. 2-5 are illustrated as including a heat sink 66, one skilled in the art will recognize that heat sink 66 may be omitted in POL structures that include low-power or non-power semiconductor devices. In such embodiments, thermal interface layer 68, 80 may also optionally be omitted thereby exposing the top surfaces of conducting shims to convective heat transfer.

Figure 6:
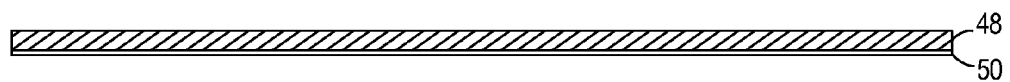
FIGS. 6-16 are schematic cross-sectional side views of a POL sub-module during various stages of a manufacturing/build-up process according to embodiments of the invention.
Figure 7:
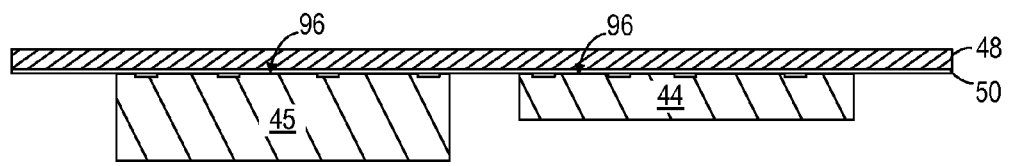

Referring now to FIGS. 6-16, detailed views of the process steps for a technique of manufacturing POL sub-module 42 of FIG. 2 and POL sub-module 78 of FIGS. 3 and 4 are provided, according to an embodiment of the invention. Referring first to FIG. 6, the build-up process of POL sub-module 42, 78 begins with applying an adhesive layer 50 onto dielectric layer 48. In a next step of the technique, one or more semiconductor device(s) 44, 45 (e.g., two semiconductor devices) are secured to dielectric layer 48 by way of adhesive layer 50, as illustrated in FIG. 7. To secure the semiconductor devices 44, 45 to dielectric layer 48, the top surfaces 96 of semiconductor devices 44, 45 are placed onto adhesive layer 50. Adhesive 50 is then cured to secure semiconductor devices 44, 45 onto dielectric layer 48.

Figure 8:
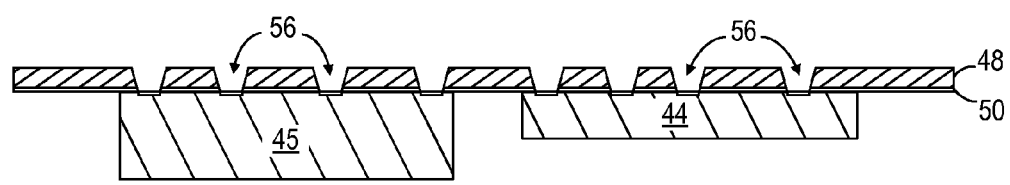

A plurality of vias 56 is then formed through adhesive layer 50 and dielectric layer 48, as illustrated in FIG. 8. According to embodiments of the invention, vias 56 may be formed by way of a laser ablation or laser drilling process, plasma etching, photo-definition, or mechanical drilling processes.

While the formation of vias 56 through adhesive layer 50 and dielectric layer 48 is shown in FIG. 8 as being performed after placement of semiconductor devices 44, 45 onto adhesive layer 50, it is recognized that the placement of semiconductor devices 44, 45 could occur after to via formation. Alternately, depending on constraints imposed by via size, semiconductor devices 44, 45 could first be placed on adhesive layer 50 and dielectric layer 48, with the vias 56 subsequently being formed at locations corresponding to a plurality of metalized circuits and/or connection pads contact pads 58 formed on semiconductor devices 44, 45. Furthermore, a combination of pre- and post-drilled vias could be employed.

Figure 9:
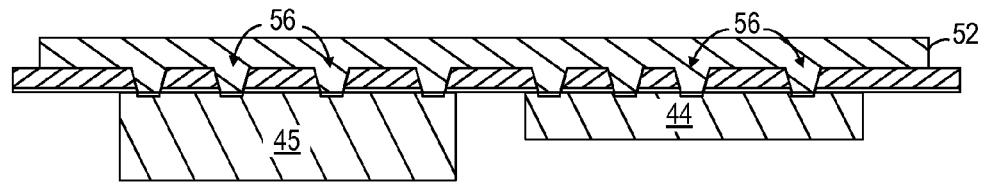
Figure 10:
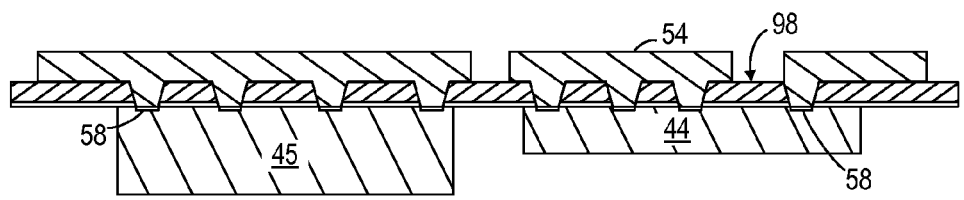

Referring now to FIGS. 9 and 10, upon securing of semiconductor devices 44, 45 on the dielectric layer 48 and the formation of vias 56, the vias 56 are cleaned (such as through a reactive ion etching (RIE) desoot process) and subsequently metalized to form a metallization or interconnection layer 54. Metallization layer 54 is typically formed through a combination of sputtering and electroplating applications, although it is recognized that other electroless methods of metal deposition could also be used. For example, a titanium adhesion layer and copper seed layer may first be applied via a sputtering process, followed by an electroplating process that increases a thickness of the copper to a desired level. The applied metal material is then subsequently patterned into metal interconnects 54 having a desired shape and that function as vertical feed-throughs formed through dielectric layer 48 and adhesive layer 50. Metal interconnects 54 extend out from circuits and/or connection pads contact pads 58 of semiconductor devices 44, 45, through vias/opening 56, and out across a top surface 98 of dielectric layer 48.

Figure 11:
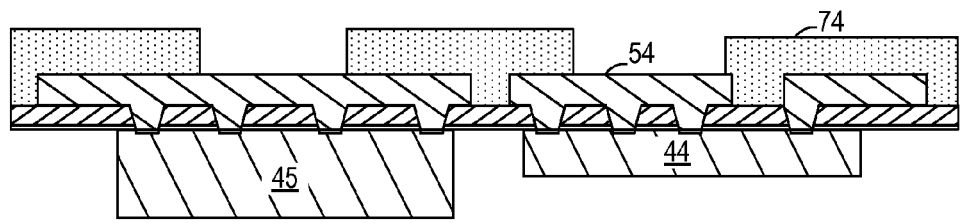

As shown in FIG. 11, a solder mask layer 74 is applied over the patterned metal interconnects 54 to provide a protective coating and define interconnect pads. In an alternative embodiment, it is recognized that that the interconnect pads can have a metal finish to aid solderability, such as Ni or Ni/Au.

Figure 12:
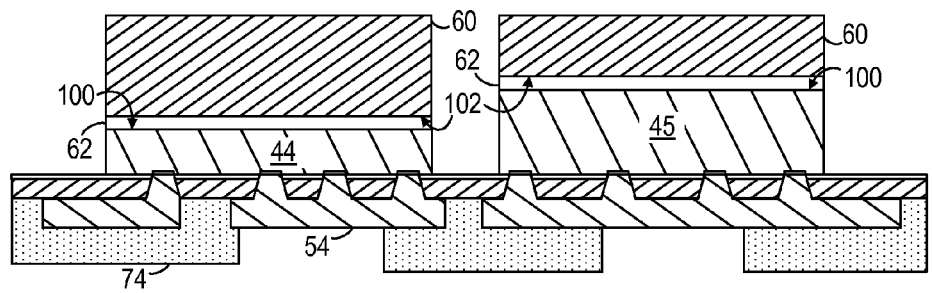

Referring now to FIG. 12, in a next step of the fabrication technique, a conductive contact layer 62 is applied to a bottom surface 100 of semiconductor devices 44, 45. A bottom surface 102 of conducting slabs 60 are then coupled to semiconductor device 44, 45 by way of the conductive contact layer 62.

According to one embodiment of the invention, and as shown in FIG. 12, semiconductor devices 44, 45 may be of varying thickness/height. In order to equalize the overall height of respective semiconductor devices 44, 45, conducting slabs 60 may be of differing height so that the overall thickness/height of each semiconductor device 44, 45/conducting slab pair 60 is equal and a back surface of the conducting slabs 60 is "planarized."

Figure 13:
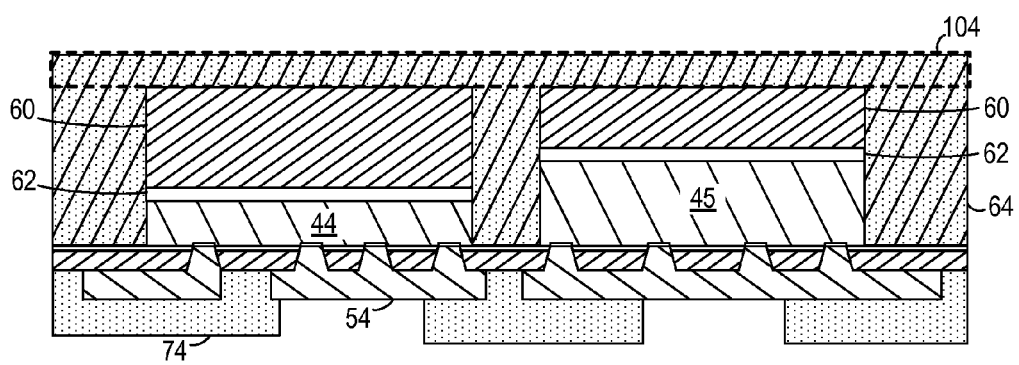
Figure 14:
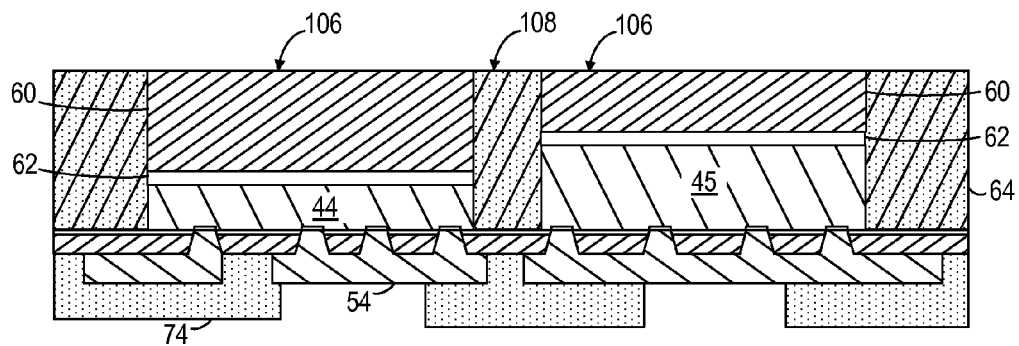

As shown in FIG. 13, the build-up technique of manufacturing POL sub-module 42, 78 continues with the application of a dielectric filler material 64 to fill in gaps in POL sub-module 42, 78 between and around semiconductor devices 44, 45 and conducting slabs 60, so as to constrain dielectric layer 48 and provide additional electrical insulation and structural integrity to POL sub-module 42, 78. In one embodiment, dielectric filler material 64 is applied using an overmolding technique and cured. After dielectric filler material 64 is cured, a portion 104 of dielectric filler material 64 is removed using a grinding operation to expose conducting slabs 60. This grinding operation may also be used to remove any variation in the height of conducting slabs 60 so that a top surface 106 of conducting slabs 60 and a top surface top surface 108 of dielectric filler material 64 is coplanar, as shown in FIG. 14. Alternatively, an overmolding or encapsulating technique may be used to apply dielectric filler material 64 such that the top surface 108 of the cured dielectric filler material 64 is flush with the top surface 106 of conducting slabs 60 absent a grinding step. In yet another embodiment, dielectric filler material 64 may be applied using an underfill technique.

Figure 15:
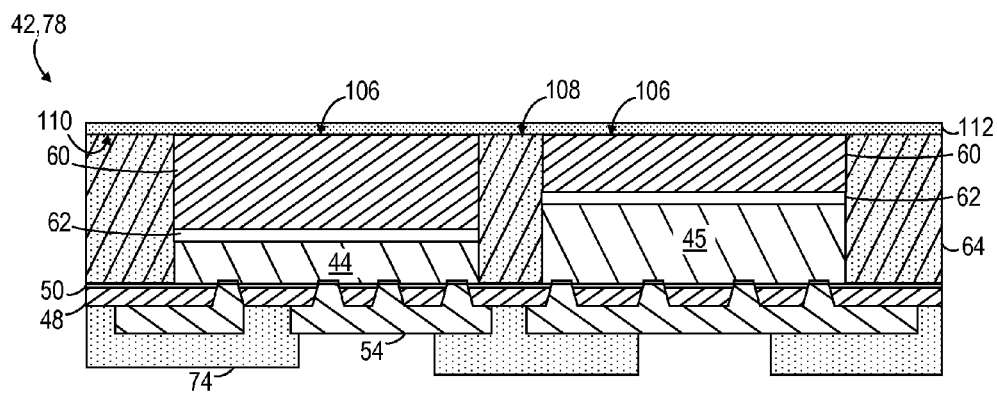

In a next step of the fabrication process, a first side 110 of a thermal interface 112 is applied to respective top surfaces 106, 108 of conducting slabs 60 and dielectric filler material 64, as shown in FIG. 15. In embodiments where thermal interface 112 comprises single thermal interface layer 68 (FIG. 2), thermal interface 112 is applied in one step to the top surfaces 106, 108 of conducting slabs 60 and dielectric filler material 64. Alternatively, thermal interface 112 may be a multi-layer thermal interface 80 as shown in FIGS. 3 and 4. Referring as well to FIGS. 3 and 4, the individual layers of multi-layer thermal interface 80 are applied sequentially to the top surfaces 106, 108 of conducting slabs 60 and dielectric filler material 64 using a build-up technique wherein first thermal interface layer 82 is applied atop dielectric filler material 64 and conducting slabs 60, ceramic insulator layer 84 is next applied atop first thermal interface layer 82, and second thermal interface layer 86 is finally applied to the top surface of ceramic insulator layer 84. wherein first thermal interface layer 82 is applied atop dielectric filler material 64 and conducting shims 60, ceramic insulator layer 84 is next applied atop first thermal interface layer 82, and second thermal interface layer 86 is finally applied to the top surface of ceramic insulator layer 84.

Figure 16:
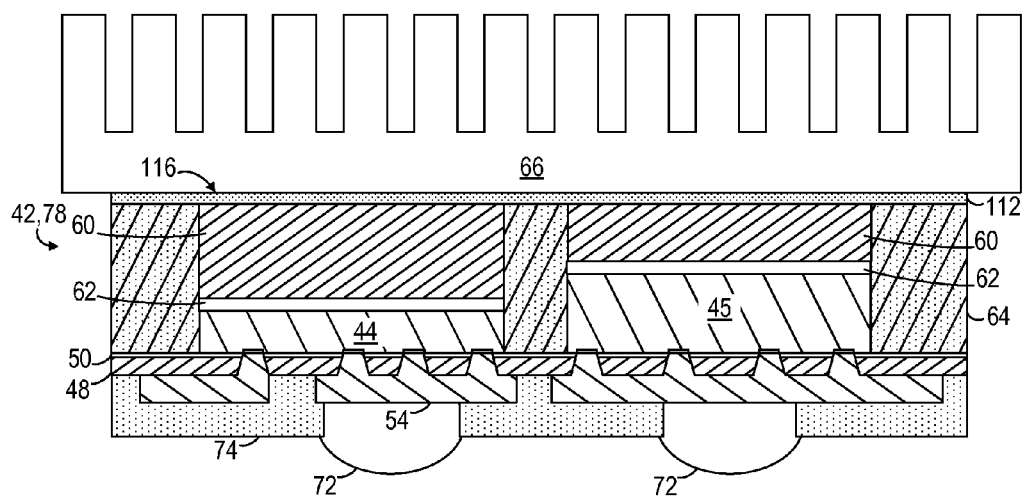
Figure 17:
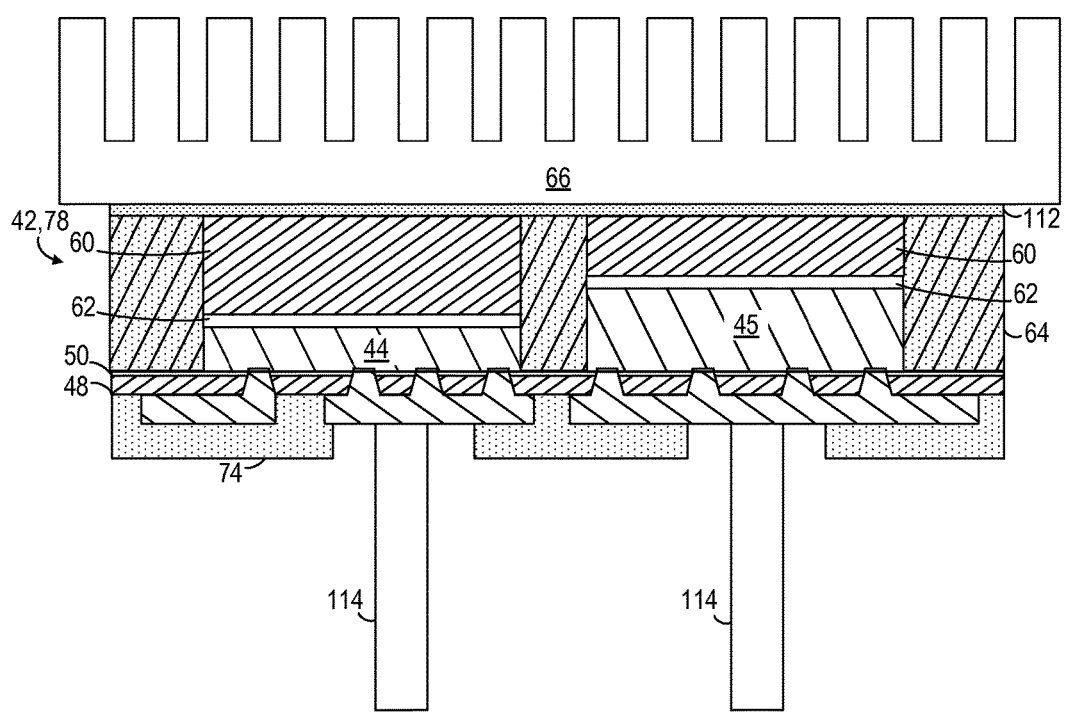
FIG. 17 is a schematic cross-sectional side view of a portion of a leaded POL sub-module according to another embodiment of the invention.

In a next step of the fabrication technique, I/O connections 70 are applied to solder mask layer 74. In one embodiment, I/O connections 70 are solder bumps 72, as shown in FIG. 16. In an alternative embodiment of the build-up technique, I/O connections 70 are configured as leads 114 for a through-hole component, as shown in FIG. 17. After the build-up process of POL sub-module 42, 78 is complete, a heat sink 66 is affixed to a second side 116 of thermal interface 112. POL sub-module 42, 78 may be singulated for surface mounting to an external circuit, such as PCB 94 (FIG. 5).

Figure 18:
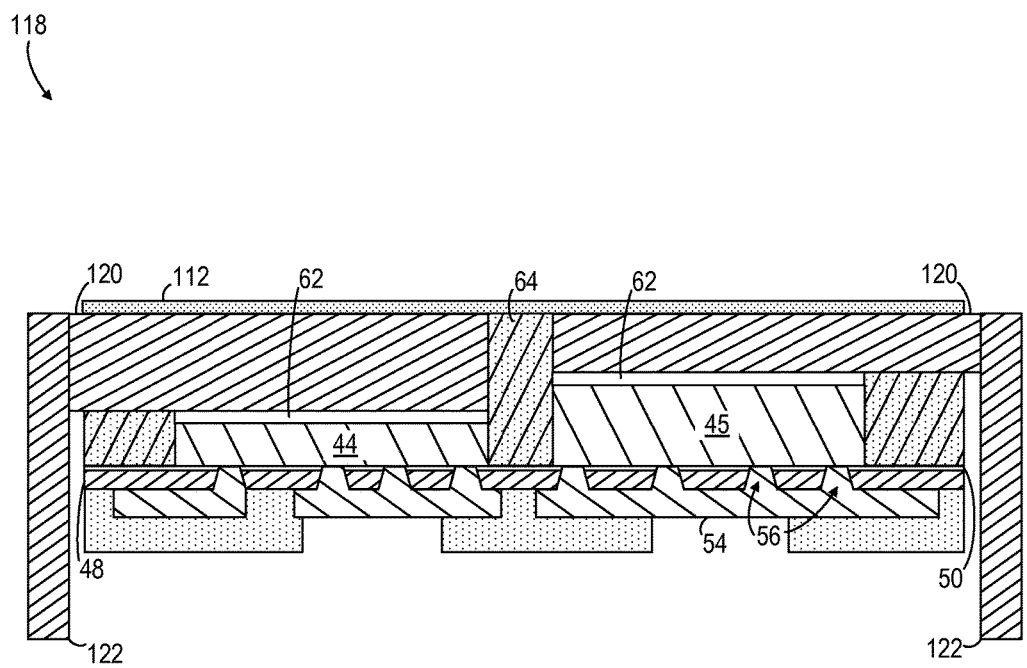
FIG. 18 is a schematic cross-sectional side view of a portion of a leaded POL sub-module according to another embodiment of the invention.

Referring now to FIG. 18, an alternative embodiment of a POL sub-module 118 is illustrated. POL sub-module 118 includes a number of components similar to components shown in POL sub-module 42 of FIG. 2, and thus numbers used to indicate components in FIG. 2 will also be used to indicate similar components in FIG. 18.

As shown, POL sub-module 118 includes semiconductor device(s) 44 mounted to a dielectric layer 48 by way of an adhesive layer 50. Metal interconnects 54 extend through vias 56 formed in dielectric layer 48 to connect to contact pads (not shown) on semiconductor device(s) 44. A heatspreader/conducting slab 120 is coupled to each semiconductor device 44 by way of a conductive contact layer 62. Similar to conducting slabs 60 of FIG. 2, conducting slabs 120 comprise a metal or alloy material, such as, for example, copper, aluminum, molybdenum, or combinations thereof. Dielectric filler material 64 is provided to fill gaps in POL sub-module 118 between and around semiconductor devices 44 and conducting slabs 120. A thermal interface 112, such as thermal interface layer 68 (FIG. 2) or multi-layer thermal interface 80 (FIG. 3), is provided atop dielectric filler material 64 and conducting slabs 120.

As shown in FIG. 18, conducting slabs 120 are coupled to a lead-frame 122. According to embodiments of the invention, lead-frame 122 is pre-attached to conducting slab 120 prior to placement of conducting slabs 120 into conductive contact layer 62. For example, lead-frame 122 and conducting slabs 60 may be a pre-fabricated from a common copper slab or lead-frame 122 may be pre-attached to conducting slabs 60 by way of a high temperature joining process like soldering, brazing, welding, or other similar method for assembly into POL sub-module 118. Alternatively, it is recognized that lead-frame 122 may be post-attached instead, after fabrication of POL sub-module 118 is completed.

Figure 19:
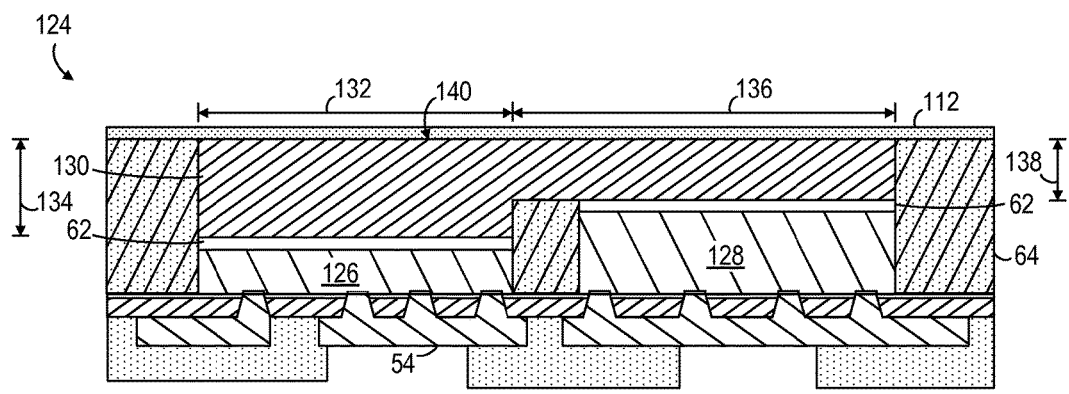
FIG. 19 is a schematic cross-sectional side view of a portion of a POL sub-module having a stepped conducting shim according to an embodiment of the invention.
Figure 20:
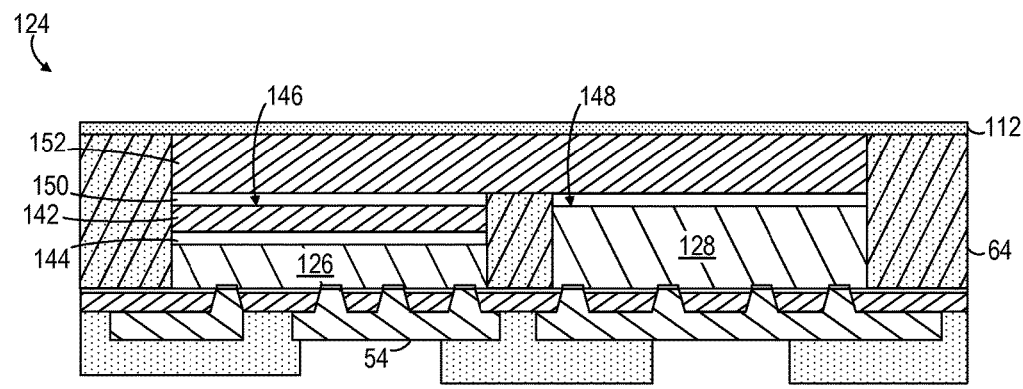
FIG. 20 is a schematic cross-sectional side view of a portion of a POL sub-module having a multi-layer conducting shim assembly according to an embodiment of the invention.

Referring now to FIGS. 19 and 20, two alternative embodiments of a POL sub-module 124 are illustrated that account for situations wherein POL sub-module 124 includes semiconductor devices 126, 128 of differing heights. Again, as POL sub-module 124 includes a number of components similar to components shown in POL sub-module 42 of FIG. 2, and thus numbers used to indicate components in FIG. 2 will also be used to indicate similar components in FIGS. 19 and 20.

Referring first to FIG. 19, an alternative embodiment is shown that includes a heatspreader/conducting slab 130 having a stepped configuration. As shown, a first portion 132 of conducting slab 130 has a first height or thickness 134 and a second portion 136 of conducting slab 130 has a second height or thickness 138 to account for the differing heights of semiconductor devices 126, 128 while maintaining a planar top surface 140 of conducting slab 130.

An alternative embodiment of POL sub-module 124 is shown in FIG. 20, wherein a first heatspreader/conducting slab 142 is coupled to semiconductor device 126 using a first conductive contact layer 144, such as, for example, a solder similar to conductive contact layer 62 (FIG. 2). First conducting slab 142 is sized such that an upper surface 146 of first conducting slab 142 and an upper surface 148 of semiconductor device 128 are coplanar. A second conductive contact layer 150 is then applied to the top surfaces of first conducting slab 142 and semiconductor device 128. In one embodiment, second conductive contact layer 150 comprises solder. A second heatspreader/conducting slab 152, which is sized to span at least the overall width of semiconductor devices 126, 128 is then affixed to second conducting slab 152 as shown.

While embodiments of the invention have been described as including power semiconductor devices used in high voltage power applications, one skilled in the art will recognize that the techniques set forth herein are equally applicable to low power applications and chip packages that incorporate non-power semiconductor devices or semiconductor devices having electrical connections that run to only a single side of the semiconductor devices. In such applications, integrated chip packages may be formed similar to POL sub-module 42 (FIG. 2) but absent thermal interface layer, as described in more detail with respect to FIG. 21, thereby leaving the back sides of conducting slabs 60 exposed for convective cooling. Alternatively, a thermal interface layer 68 may be formed atop conducting slabs 60 to provide electrical insulation between conducting slabs 60 and the ambient environment and protect against shorts, as described in more detail with respect to FIG. 22.

Figure 21:
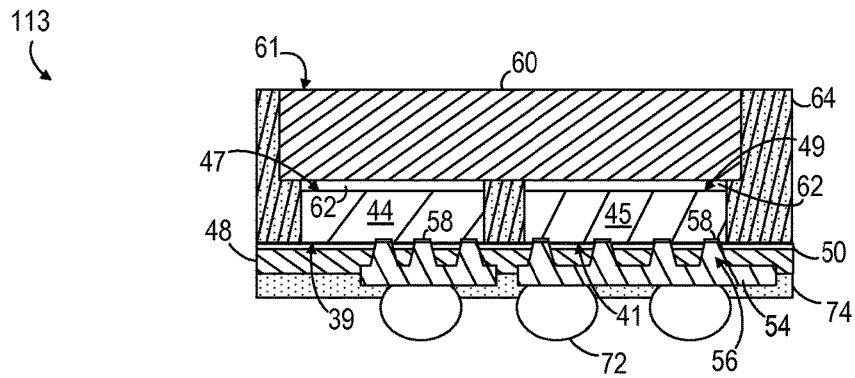
FIG. 21 is a schematic cross-sectional side view of a portion of a POL sub-module according to another embodiment of the invention.
Figure 22:
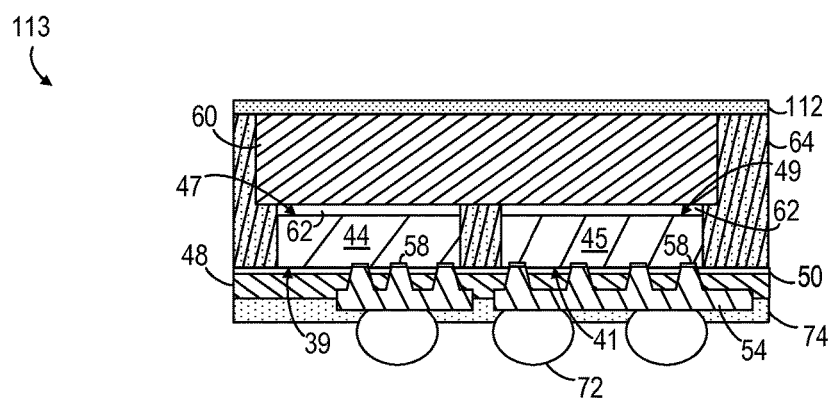
FIG. 22 is a schematic cross-sectional side view of a portion of a POL sub-module according to another embodiment of the invention.
Figure 23:
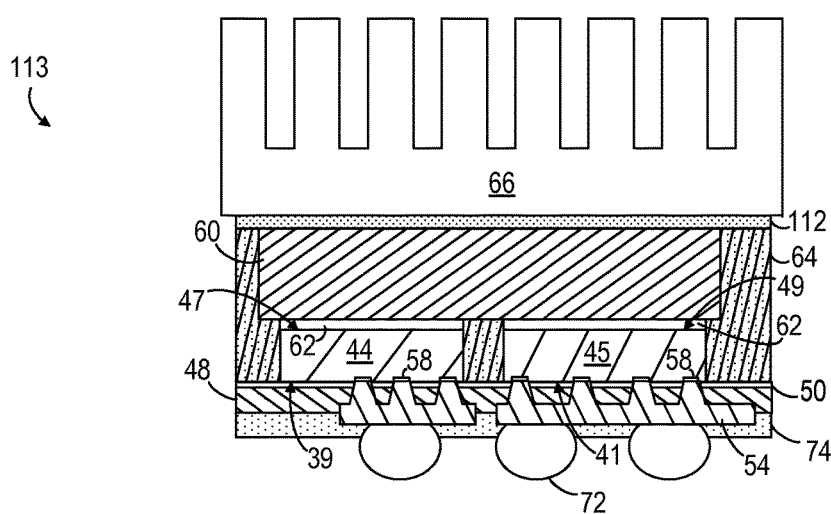
FIG. 23 is a schematic cross-sectional side view of a portion of a POL sub-module according to another embodiment of the invention.

Referring now to FIGS. 21-23, a semiconductor device assembly 113 is described with respect to alternative embodiments of the invention. As semiconductor device assembly 113 includes a number of components similar to the components shown in POL sub-module 42 of FIG. 2, similar numbering is used herein to indicate similar components.

Referring first to the embodiment illustrated in FIG. 21, semiconductor device assembly 113 includes a semiconductor device 44 coupled to a top surface of dielectric layer 48. According to various embodiments, semiconductor device 44 is a power semiconductor device such as a switch or rectifier, as examples. Semiconductor device assembly 113 also includes an electrically conducting shim 45. Conducting shim 45 is an electrically conducive material such as, for example, copper, copper-molybdenum, copper-tungsten, aluminum-silicon, aluminum-silicon carbide, aluminum-graphite, copper-graphite, and the like.

As shown, a first surface 39 of semiconductor device 44 and a first surface 41 of conducting shim 45 are coupled to dielectric layer 48 via adhesive layer 50. Conducting shim 45 is sized such that a second surface 49 of conducting shim 45 is substantially co-planar with a second surface 47 of semiconductor device 44, as shown in FIG. 21. A conducting slab or heatspreader 60 is coupled to second surface 47 of semiconductor device 44 and second surface 49 of conducting shim 45 via a conductive contact layer 62.

Conductive contact layer 62 is an electrically and thermally conductive material such as, for example, a solder material, a conductive adhesive, or a sintered silver, as examples. Heatspreader 60 comprises a material that is thermally and electrically conductive. As such, heatspreader 60 electrically couples second surface 47 of semiconductor device 44 to conducting shim 45 and facilitates heat transfer away from semiconductor device 44. Metallization layer 54 extends through vias 56 formed in dielectric layer 48 and creates electrical connections to both the first surface 39 and the second surface 47 of semiconductor device 44.

According to embodiments where semiconductor device 44 is a low power device, the top surface 59 of conducting slab 60 may be left exposed for convective cooling, as shown in FIG. 21. Alternatively, as shown in FIG. 22, a thermal interface 112, such as thermal interface layer 68 (FIG. 2), or other insulating material may be applied as a protective layer to coat the top surface 59 of conducting slab 60.

Referring to FIG. 23, in embodiments where semiconductor device 44 is a high power device, a heat sink, such as heat sink 66 is coupled to conducting slab 60 via a thermal interface layer 112 to provide additional heat transfer for semiconductor device 44. According to various embodiments, thermal interface layer 112 may be a single-layer substrate that is thermally conductive and either electrically conductive or electrically insulating, as described with respect to thermal interface layer 68 (FIG. 2). Alternatively, thermal interface layer 112 may be a multi-layer substrate similar to thermal interface layer 80 described with respect to FIGS. 3 and 4.

While the embodiments disclosed in FIGS. 21-23 are described above as including one power semiconductor device 44, conducting shim 45, and heatspreader 60, one skilled in the art will recognize that semiconductor device assembly 113 may be manufactured with one or more semiconductor devices, conducting shims, and heatspreaders within the scope of the invention.

Beneficially, embodiments of the invention thus provide a POL packaging and interconnect structure that includes a thermal interface that is absent the drawbacks of a DBC substrate. For example, as thermal interface layer 68 and multi-layer thermal interface 80 may be applied in a fabrication step that occurs after dielectric filler material 64 is applied and cured, dielectric filler material 64 may be applied using an encapsulating or overmolding technique rather than a more costly and time-consuming underfill process that is more likely to result in voids. Also, because the thermal interface is formed during the package build-up process, rather than being provided as a prefabricated component, the dimensions and materials of thermal interface may be tailored based on desired operating characteristics. Further, the use of conducting slabs 60, 120, 130, 142, and/or 152 provides the ability to account for semiconducting devices of varying heights.

Therefore, according to one embodiment of the invention, a semiconductor device module includes a dielectric layer, a semiconductor device having a first surface coupled to the dielectric layer, and a conducting shim having a first surface coupled to the dielectric layer. The semiconductor device also includes an electrically conductive heatspreader having a first surface coupled to a second surface of the semiconductor device and a second surface of the conducting shim. A metallization layer is coupled to the first surface of the semiconductor device and the first surface of the conducting shim. The metallization layer extends through the dielectric layer and is electrically connected to the second surface of the semiconductor device by way of the conducting shim and the heatspreader.

According to another embodiment of the invention, a method of forming a semiconductor device package includes providing a semiconductor device, affixing a first surface of the semiconductor device to a first surface of a dielectric layer, and affixing a first surface of a conductive shim to the first surface of the dielectric layer. The method also includes disposing a heatspreader on a second surface of the semiconductor device and a second surface of the conductive shim, the heatspreader electrically coupling the semiconductor device to the conducting shim, and forming a metal interconnect structure on a second surface of the dielectric layer. The metal interconnect structure extends through vias formed in the dielectric layer to contact the first surface of the semiconductor device and the first surface of the conductive shim.

According to yet another embodiment of the invention, a power overlay (POL) structure includes an insulating substrate, a power device attached to the insulating substrate via an adhesive layer and an electrically conducting shim attached to the insulating substrate via the adhesive layer. The POL structure further includes an electrically and thermally conducting slab coupled to a top surface of the power device and a top surface of the conducting shim and a metallization layer extending through the insulating substrate. The metallization layer is electrically coupled to contact locations on the first and second surfaces of the power device.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A semiconductor device package comprising:
a dielectric layer;
an adhesive layer applied to a surface of the dielectric layer;
a semiconductor device having a first surface coupled to the dielectric layer by way of the adhesive layer, the first surface having at least one contact pad positioned thereon;
a conducting shim having a first surface coupled to the dielectric layer by way of the adhesive layer;
an electrically conductive heatspreader having a first surface coupled to a second surface of the semiconductor device and a second surface of the conducting shim; and
a metallization layer coupled to the first surface of the semiconductor device and the first surface of the conducting shim, the metallization layer extending through the dielectric layer to contact the at least one contact pad of the semiconductor device and electrically connected to the second surface of the semiconductor device by way of the conducting shim and the heatspreader.

2. The semiconductor device package of claim 1 wherein the semiconductor device comprises a power device.

3. The semiconductor device package of claim 1 wherein the second surface of the semiconductor device and the second surface of the conducting shim are substantially co-planar.

4. The semiconductor device package of claim 1 further comprising a thermal interface layer coating a second surface of the heatspreader, the thermal interface layer comprising a material that is electrically insulating and thermally conductive.

5. The semiconductor device package of claim 4 wherein the thermal interface layer comprises at least one of an organic material and a plurality of electrically conducting particles suspended in a resin.

6. The semiconductor device package of claim 4 further comprising a heat sink coupled to the thermal interface layer.

7. The semiconductor device package of claim 1 further comprising a conductive contact layer coupling the semiconductor device and the conducting shim to the heatspreader.

8. The semiconductor device package of claim 1 wherein a second surface of the heatspreader is exposed to ambient air for convective heat transfer.

9. The semiconductor device package of claim 1 further comprising an encapsulant surrounding the semiconductor device and the conducting shim.

10. A method of forming a semiconductor device package comprising:
providing a dielectric layer;
applying an adhesive layer to a surface of the dielectric layer;
coupling a first surface of a semiconductor device to the dielectric layer by way of the adhesive layer;
coupling a first surface of a conductive shim to the dielectric layer by way of the adhesive layer;
disposing a heatspreader on a second surface of the semiconductor device and a second surface of the conductive shim, the heatspreader electrically coupling the semiconductor device to the conductive shim; and forming a metal interconnect structure on a surface of the dielectric layer, the metal interconnect structure extending through vias formed in the dielectric layer to contact the first surface of the semiconductor device and the first surface of the conductive shim.

11. The method of claim 10 further comprising encapsulating the semiconductor device, the conductive shim, and at least a portion of the heatspreader with a polymeric material.

12. The method of claim 10 further comprising forming a thermal interface layer on a top surface of the heatspreader.

13. The method of claim 12 further comprising coupling a heat sink to the thermal interface layer.

14. The method of claim 12 further comprising underfilling a space between the dielectric layer and the thermal interface layer with a dielectric material.

15. A power overlay (POL) structure comprising:
an insulating substrate;
a power device attached to the insulating substrate via an adhesive layer;
an electrically conducting shim attached to the insulating substrate via the adhesive layer, the electrically conducting shim positioned adjacent the power device on the insulating substrate;
an electrically and thermally conducting slab coupled to a top surface of the power device and a top surface of the conducting shim; and
a metallization layer extending through the insulating substrate, the metallization layer electrically coupled to contact locations on a first surface and a second surface of the power device.

16. The POL structure of claim 15 wherein the top surfaces of the power device and the conducting shim are substantially co-planar.

17. The POL structure of claim 15 further comprising an electrically insulating layer having a first side coupled to the electrically conducting shim.

18. The POL structure of claim 17 wherein the electrically insulating layer comprises an organic, thermally conductive material.

19. The POL structure of claim 18 further comprising a heat sink coupled to a second side of the electrically insulating layer.

20. The POL structure of claim 19 wherein the electrically insulating layer comprises a multi-layer substrate, the multi-layer substrate comprising:
a first layer having a first surface coupled to the electrically conducting heat spreader;
a second layer having a first surface coupled to the heat sink; and
a ceramic layer coupled between the first and second layers.

21. The semiconductor package of claim 1 wherein the first surface of the semiconductor device and the first surface of the conducting shim are substantially co-planar.

* * * * *